United States Patent
Bowers et al.

(10) Patent No.: US 6,815,984 B1
(45) Date of Patent: Nov. 9, 2004

(54) PUSH/PULL MULTIPLEXER BIT

(75) Inventors: Benjamin J. Bowers, Starkville, MS (US); Brian P. Evans, Starkville, MS (US); Jeffery Scott Hunt, Ackerman, MS (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/940,406

(22) Filed: Aug. 27, 2001

(51) Int. Cl.[7] .................................................. H03B 1/03
(52) U.S. Cl. .................... 327/112; 327/410; 327/427; 326/83
(58) Field of Search ................... 327/408–410, 327/427, 108, 112, 307; 326/56–58, 62, 82, 83, 86, 87, 89–91

(56) References Cited

U.S. PATENT DOCUMENTS

| | | | | |
|---|---|---|---|---|
| 4,804,867 A | * | 2/1989 | Okitaka et al. | 326/58 |
| 5,548,229 A | * | 8/1996 | Segawa et al. | 326/57 |
| 5,604,453 A | * | 2/1997 | Pedersen | 327/112 |
| 5,633,603 A | * | 5/1997 | Lee | 326/83 |
| 5,852,382 A | * | 12/1998 | Lentini et al. | 327/534 |
| 5,900,744 A | * | 5/1999 | Bisen et al. | 326/58 |
| 5,920,210 A | * | 7/1999 | Kaplinsky | 327/112 |
| 6,169,420 B1 | * | 1/2001 | Coddington et al. | 326/83 |
| 6,181,165 B1 | * | 1/2001 | Hanson et al. | 326/81 |
| 6,313,663 B1 | * | 11/2001 | Mueller et al. | 326/83 |
| 6,359,471 B1 | * | 3/2002 | Mueller et al. | 326/81 |
| 6,535,025 B2 | * | 3/2003 | Terzioglu et al. | 327/51 |
| 6,731,151 B1 | * | 5/2004 | Doutreloigne | 327/333 |

* cited by examiner

Primary Examiner—Terry D. Cunningham
Assistant Examiner—Hai L. Nguyen
(74) Attorney, Agent, or Firm—Christopher P. Maiorana, P.C.

(57) ABSTRACT

An apparatus comprising an input section and an output section. The input section may be configured to generate a first control signal and a second control signal in response to an input signal and a select signal. The output section may be configured to generate an output signal in response to the first and second control signals. The output signal may be (i) related to the input signal when in a first mode and (ii) disabled when in a second mode.

21 Claims, 4 Drawing Sheets

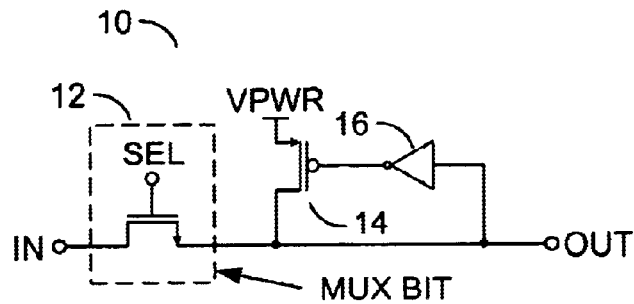
(CONVENTIONAL)
FIG. 1
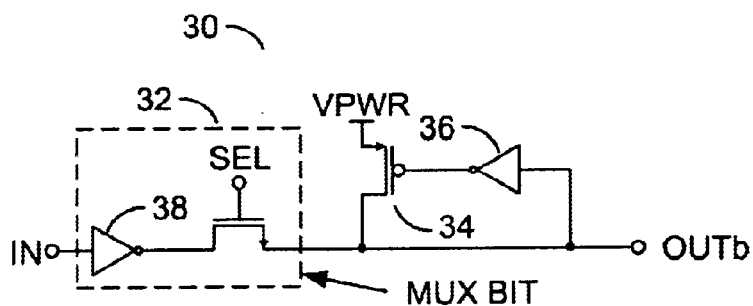
(CONVENTIONAL)
FIG. 2
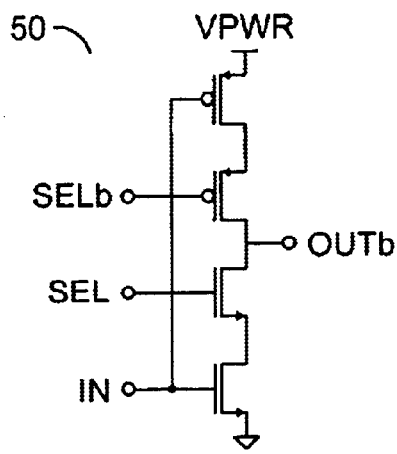
(CONVENTIONAL)
FIG. 3a
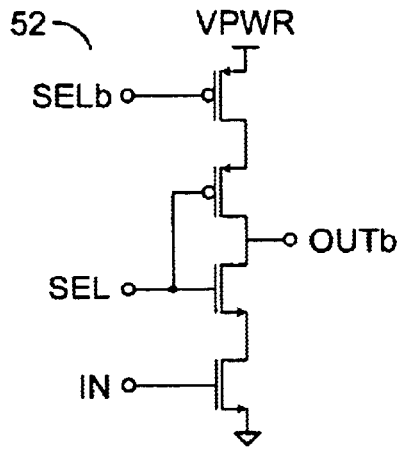
(CONVENTIONAL)
FIG. 3b

PUSH/PULL MULTIPLEXER BIT

FIELD OF THE INVENTION

The present invention relates to a method and/or architecture for implementing multiplexers generally and, more particularly to a method and/or architecture for implementing programmable tri-state circuits that may be used as multiplexer elements.

BACKGROUND OF THE INVENTION

A number of conventional programmable approaches may be used to implement multiplexers. Such conventional approaches typically implement a pass gate, an inverter driving the pass gate or an enabled inverter.

Referring to FIG. 1, a diagram of a circuit 10 implementing a conventional multiplexer bit with a simple pass gate is shown. The circuit 10 comprises a multiplexer bit circuit 12, a device 14 and an inverter 16. The circuit 12 is sized for speed (i.e., the input loading depends on size of device, as the size increases the input loading increases). The circuit 12 loads the input IN when the bit 12 is selected via the signal SEL. The circuit 10 also implements a level restore circuit, since a full HIGH cannot be passed through the n-channel device within the multiplexer bit 12. Level restore circuits are connected to the output of a multiplexer, where a multiplexer is implemented as multiple outputs of the bits 12 connected together. Therefore, a driver (not shown) configured to drive the input signal IN needs to over-power multiple level restore circuits, when implemented in a multiplexer design.

Referring to FIG. 2, a diagram of circuit 30 implementing another conventional multiplexer bit circuit 32 with a pass gate and an inverter is shown. The circuit 30 comprises a multiplexer bit circuit 32, a device 34 and an inverter 36. An inverter 38 within the multiplexer bit 32 isolates the internal nodes of the circuit 30 from the input IN. However, the circuit 32 consumes current independent of the multiplexer bit selection signal SEL due to an output of the inverter 38 switching when the input IN switches. The circuit 30 also implements a level restore circuit, since a full HIGH level cannot be passed through the n-channel device within the multiplexer bit 32. Level restore circuits can be connected to the output of a multiplexer, where a multiplexer is implemented as a number of the circuits 32 having outputs connected together.

Referring to FIG. 3a, a diagram of a circuit 50 implementing a conventional multiplexer bit with an enabled inverter is shown. While the circuit 50 does not implement a level restore circuit, the circuit 50 has a number of disadvantages. For example, the circuit 50 has a large gate load on the input IN. The gate load is large since the series transistors are sized to have an equivalent drive strength as a single transistor.

Referring to FIG. 3b, a diagram of a circuit 52 implementing another conventional multiplexer bit with an enabled inverter is shown. The circuit 52, when implemented in large multiplexer configurations, has an excess amount of capacitance that appears in parallel with an input of an inverting amplifier stage between the output and the input signal IN caused by the gate overlap capacitance. The circuit 52 does not implement a level restore circuit, but has a number of disadvantages. For example, the output of a multiplexer can switch and couple to the input of an unselected bit, which causes the input to glitch or delay the input transition time. Also, the input can couple to the output and cause the output to glitch or delay the output transition time.

Conventional approaches have one or more of the following disadvantages: (i) adding loading to input lines; (ii) adding increased loading if other multiplexer bits are already connected to the input lines; (iii) switching currents that are consumed by an unconfigured bit; and (iv) lack of isolation between the output node and the input node.

SUMMARY OF THE INVENTION

The present invention concerns an apparatus comprising an input section and an output section. The input section may be configured to generate a first control signal and a second control signal in response to an input signal and a select signal. The output section may be configured to generate an output signal in response to the first and second control signals. The output signal may be (i) related to the input signal when in a first mode and (ii) disabled when in a second mode.

The objects, features and advantages of the present invention include providing a method and/or architecture for implementing a programmable tri-state circuit that may be used for constructing multiplexers that may (i) allow isolation of the output load from the input, (ii) prevent switching when the circuit is not configured (or enabled), (iii) provide rail to rail output levels, (iv) be implemented with only a small loading penalty, (v) connect an input to multiple multiplexer bits to enhance the overall routability of a switching matrix, and/or (vi) implement multiplexers that, when implemented in groups, provide consistent speed (or delay) without suffering performance penalties as the number of selected multiplexer bits connected to an input increases.

BRIEF DESCRIPTION OF THE DRAWINGS

These and other objects, features and advantages of the present invention will be apparent from the following detailed description and the appended claims and drawings in which:

FIG. 1 is a diagram of a conventional multiplexer bit with a simple pass gate;

FIG. 2 is a diagram of a conventional multiplexer bit with a pass gate and an inverter;

FIGS. 3a and 3b are diagrams of a conventional multiplexer bit and an enabled inverter;

DETAILED DESCRIPTION OF THE PREFERRED EMBODIMENTS

Figure 4:
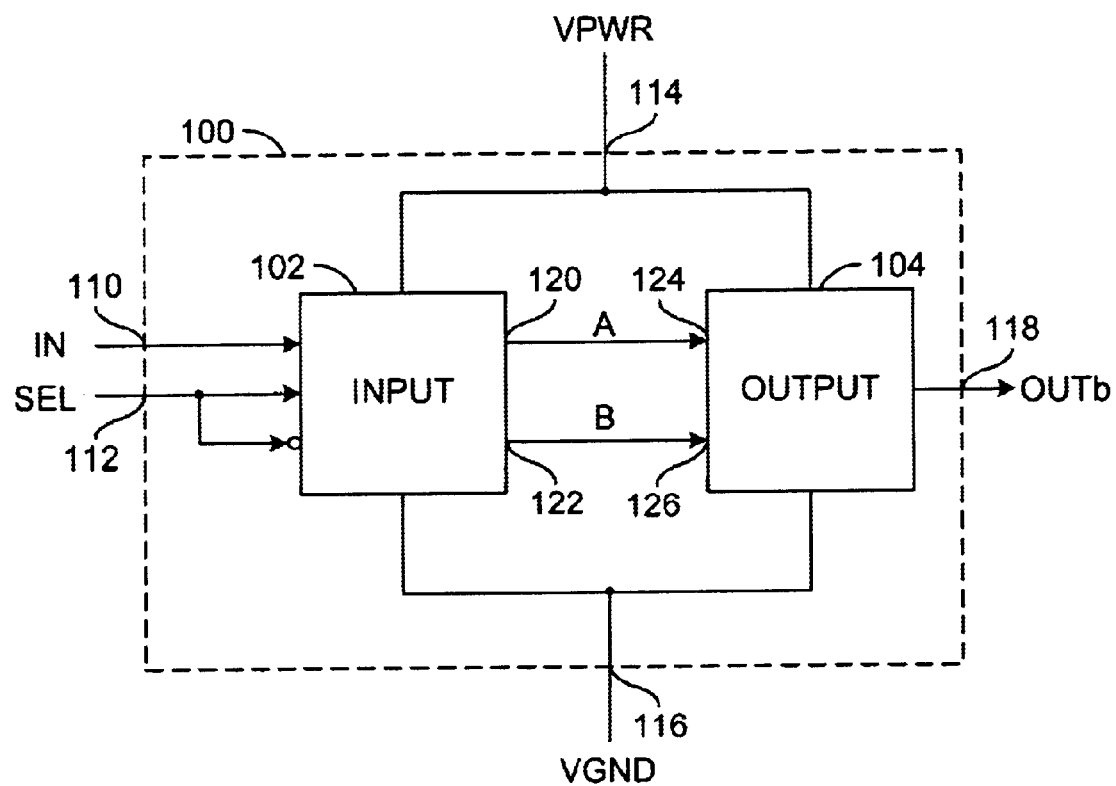
FIG. 4 is a diagram of a preferred embodiment of the present invention.

Referring to FIG. 4, a block diagram of a circuit (or system) 100 illustrating a preferred embodiment of the present invention is shown. The circuit 100 may be implemented as a push/pull multiplexer bit that may be implemented in a programmable interconnect matrix (PIM). The circuit 100 may be configured to generate an output that (i) tracks an input when in a first mode and (ii) is disabled when in a second mode.

The circuit 100 generally comprises an input block (or circuit) 102 and an output block (or circuit) 104. The circuit 100 may have an input 110 that may receive a signal (e.g., IN), an input 112 that may receive a signal (e.g., SEL), an input 114 that may be connected to a supply voltage (e.g., VPWR), an input 116 that may be connected to a ground voltage (e.g., VGND), and an output 118 that may generate a signal (e.g., OUTb). The supply voltage VPWR may be a VCC supply voltage or other appropriate supply voltage. The input circuit 102 may have an output 120 that may present a control signal (e.g., A) and an output 122 that may present a control signal (e.g., B). The control signals A and B may be described as voltage levels, nodes, or other appropriate type nomenclature. The control signal A may be presented to an input 124 of the output section 104. The control signal B may be presented to an input 126 of the output section 104. The input section 102 may generate the control signals A and B in response to the signal IN, the select signal SEL, a complement of the select signal (e.g., SELb), the supply voltage VPWR and/or the ground voltage VGND. The output circuit 104 may generate the signal OUTb in response to the control signal A, the control signal B, the supply voltage VPWR and/or the ground voltage VGND.

The circuit 100 may allow pass gates (to be discussed in connection with FIG. 5) connected to the input signal IN to be sized to reduce capacitance added to the input line IN. The circuit 100 may also isolate an output load of the signal OUTb from the input IN. The circuit 100 may prevent unnecessary switching when not selected, therefore reducing power consumption, particularly when a number of circuits 100 are connected to a common output. The circuit 100 may also provide an output voltage level that may swing from rail to rail.

Figure 5:
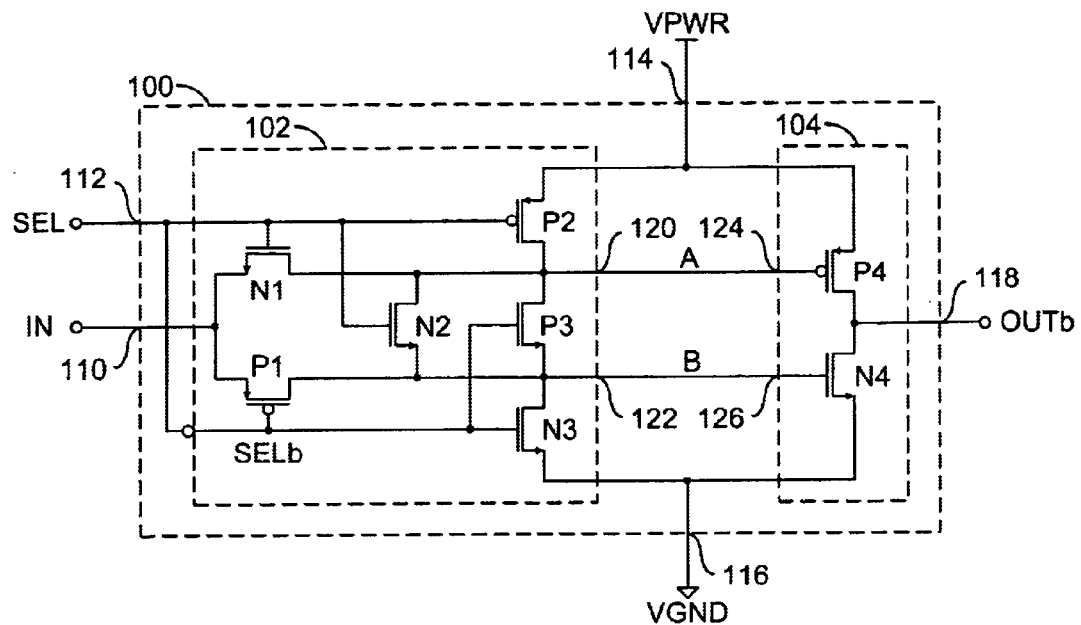
FIG. 5 is a detailed diagram of the circuit of FIG. 4.

Referring to FIG. 5, a more detailed diagram of the circuit 100 is shown. The input section 102 generally comprises a transistor N1, a transistor N2, a transistor N3, a transistor P1, a transistor P2, and a transistor P3. The output section 104 generally comprises a transistor P4 and a transistor N4. The transistors N1, N2, N3 and N4 generally comprise n-channel transistors. The transistors P1, P2, P3 and P4 generally comprise p-channel transistors. However, the particular type and/or polarity of the various transistors may be varied accordingly to meet the design criteria of a particular implementation. The transistors N1 and P1 may be implemented as a small pass gate to reduce the source/drain loading on the input signal IN.

The output signal OUTb of the output section 104 may be isolated from the input signal IN of the input section 102 independent of multiplexer bit selection (e.g., the signals SEL and SELb) via the signals A and B. When implementing a number of circuits 100 connected to a common output, coupling from non selected bits of a particular multiplexer 100 may be eliminated. By eliminating such coupling, access time push-outs or unwanted signal glitches (e.g., unwanted transient states, undetermined states, unsettled states, etc.) may be eliminated. Furthermore, the need to implement a level restore circuit is generally eliminated.

The circuit 104 (e.g., the devices P4 and N4) may be implemented as an output section. The outputsection 104 may be configured to (i) drive the output signal OUTb HIGH or LOW or (ii) tri-state the output signal OUTb. To drive the signal OUTb HIGH, the signal A may transition LOW, which may turn on the device P4. The signal B may also transition LOW, which may keep the device N4 off. To drive the signal OUTb LOW, the signal A may transition HIGH, which may turn off the device P4. The signal B may transition HIGH to turn on the device N4. When the circuit 100 is active, the signals A and B generally remain in the same state. In particular, the signals A and B may be HIGH or LOW to pull the output OUTb LOW or HIGH, respectively.

The two nodes A and B may be separated to disable the circuit 104 to tri-state the output OUTb. To tri-state the output OUTb, the signal A may be HIGH and the signal B may be LOW. The section 102 may be configured to control (or generate) the signals A and B.

When the circuit 100 is selected or enabled (e.g., the select signal SEL is HIGH and the select signal SELb is LOW) the signal IN may be passed to the signals A and B. The circuit 100 may be configured to track the input signal IN. When the circuit 100 is deselected or disabled (e.g., the signal SEL is LOW and the signal SELb is HIGH) the signal IN is not generally passed through to the nodes A and B. When the select signal SEL is LOW, a gate of the device N1 may be LOW and the device N1 may be turned off. Additionally, when the signal SELb is HIGH, a gate of the device P1 may be HIGH and the device P1 may be turned off. When the device N1 is off and the device P1 is off, the input signal IN is disabled (e.g., the signal IN does not pass through). The transistors N1 and P1 may be configured as pass gates (e.g., to either pass (enabled or selected) or not pass (disabled or deselected) the signal IN).

The transistors N2, P2, P3 and N3 may control the nodes A and B. The devices N2 and P3 may connect the nodes A and B together such that when the circuit 100 is selected, the signals A and B may be the same level, either a solid HIGH or a solid LOW. A solid HIGH may be a voltage level at the supply voltage VPWR (or other supply voltage). A solid LOW may be a voltage level at the ground voltage VGND (or other ground voltage). When the circuit 100 is selected, the devices N1 and P1 are generally on. When the signal IN is LOW, a LOW may be passed to both the nodes A and B. The n-channel device N1 may pass a solid LOW to the node A. However, the p-channel P1 may pass less-than a solid LOW (e.g., a voltage threshold above the ground level VGND) to the node B. The device N2 may also be on to pass a solid LOW level from the node A to the node B.

Similarly, when the signal IN is HIGH, the device P1 may pass a solid HIGH to the node B. The device N1 may pass less than a solid HIGH voltage (e.g., a threshold voltage below the VPWR level) to the node A. However, the device P3 may be connected between the nodes A and B to pass a solid HIGH to the node A. The devices N1, P1, N2 and P3 may be configured to pass the input IN to the nodes A and B to help ensure that the nodes A and B are at the same level as the input signal IN (e.g., a LOW or a HIGH) when the circuit 100 is selected.

When the circuit 100 is selected (e.g., the signal SEL being HIGH), the devices N1 and N2 may turn on. The device P2 may then be turned off and not affect the node A. When the circuit 100 is selected, the signal SELb may also be a LOW, which may turn on the device P1 and the device P3. The device N3 may turn off and not affect the node B.

When the circuit 100 is deselected, the devices N1, P1, N2 and P3 may be turned off and the devices P2 and N3 may be turned on (e.g., the signal SEL may be LOW). Such a configuration may pass the voltage level VPWR (or other supply voltage) to pull node A to a HIGH, which may turn off the device P4. The signal SELb may be at a HIGH, therefore the device N3 may turn on and pull the node B to ground to turn off the device N4. The circuit 102 may be configured to tri-state the output OUTb when the circuit 100 is deselected.

The input section 102 of the circuit 100 may either (i) pass the input IN to the nodes A and B by turning on the devices N1, P1, N2 or P3 and turning off the devices P2 and N3 when in a first mode (e.g., selected), or (ii) not pass the input IN to the nodes-A and B by (a) turning off the devices N1, P1, N2, and P3 and turning on the devices P2 and N3 to force the node A to a HIGH and the node B to a LOW and (b) turning off the devices P4 and N4 when in a second mode (e.g., deselected). The circuit 100 may effectively track the input signal IN to the output OUTb when in the first mode and tri-state the output OUTb when in the second mode.

A number of multiplexer bits (e.g., the circuit 100) may have outputs connected to a common net to form a multiplexer. In such a configuration, a single bit in the multiplexer may be selected (or electrically configured on) at a particular time. Therefore, only a single input signal IN of a particular selected bit may be propagated to the output of the multiplexer.

Figure 6:
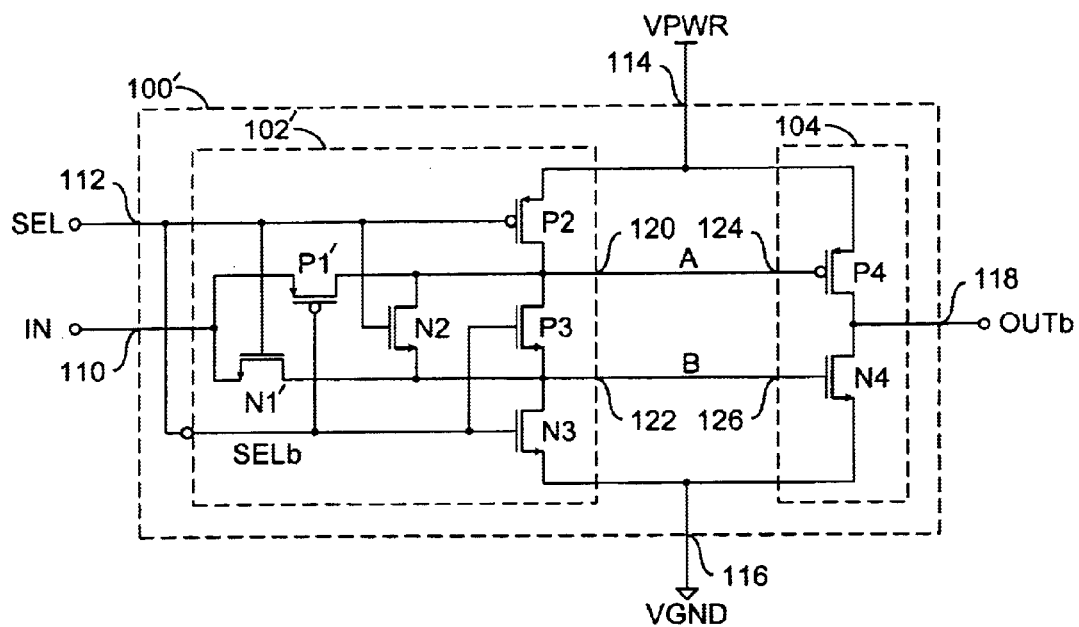
FIG. 6 is a diagram of an alternate embodiment of the present invention.

Referring to FIG. 6, a block diagram of an alternate embodiment of the circuit 100 is shown. The transistor P1' is shown connected between the signals IN, SELb and node A. The transistor N1' is shown connected between the signals IN, SEL and node B. Other configurations of the circuit 102' may be implemented to meet the design criteria of a particular implementation.

Figure 7:
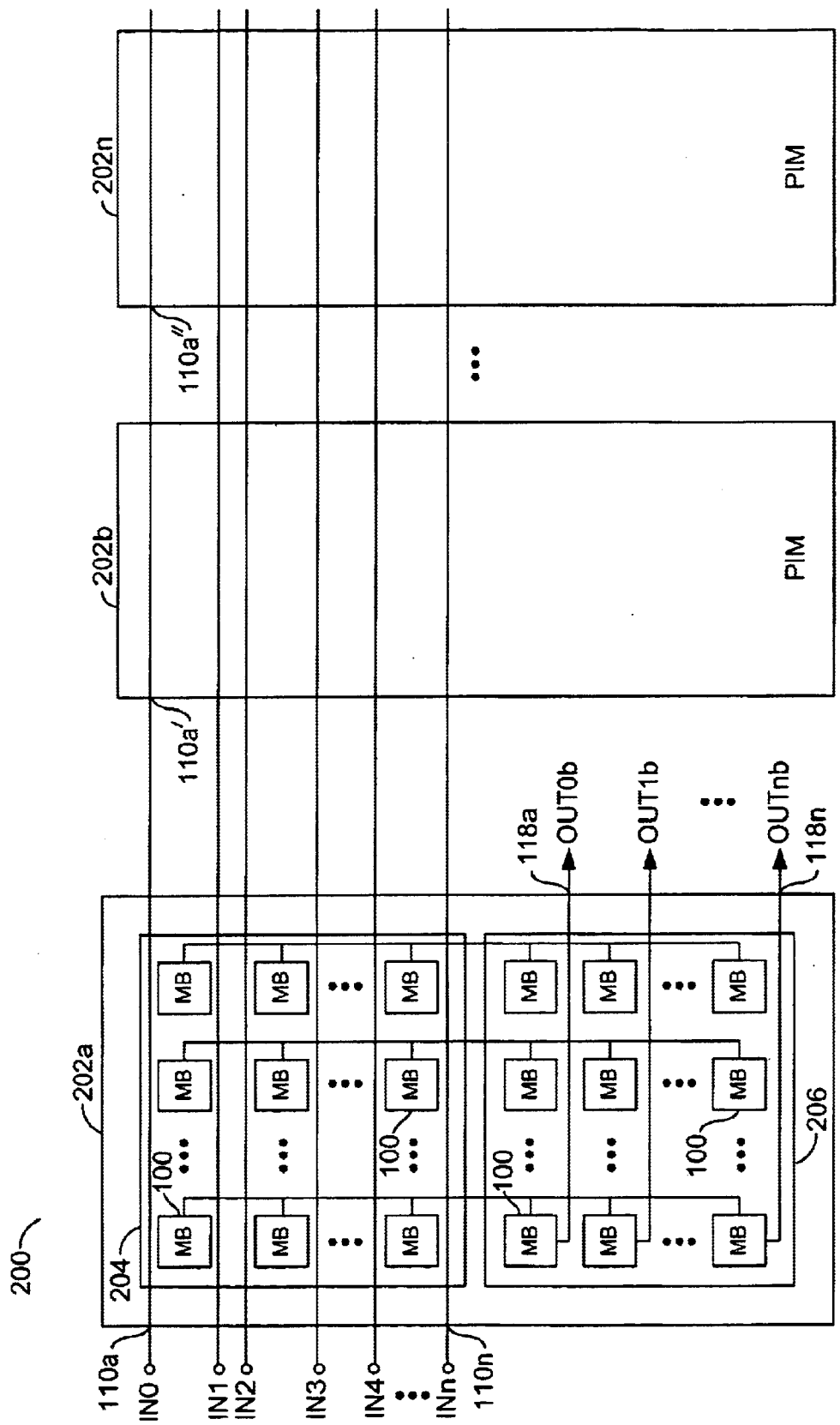
FIG. 7 is a diagram illustrating a context of the present invention implemented in a programmable interconnect matrix.

Referring to FIG. 7, an example implementation of the present invention is shown. The circuit 200 generally comprises a number of programmable interconnect matrices 202a–202n. Each of the programmable interconnect matrices 202a–202n may comprise a first stage 204 and a second stage 206. The multiple bits of the PIMs 202a–202n may be connected to a same input (e.g., the input 110a, 110a', etc.). Input load capacitance of the inputs IN0–INn may depend on the number of active multiplexer bits (e.g., circuits 100) in the PIMs 202a–202n. Generally, the propagation delay through the PIMs 202a–202n may depend on the number of active paths selected in PIMs 202a–202n. However, the present invention may isolate the loading from the PIMs 202a–202n onto the inputs IN0-INn to eliminate delay dependency on the number of active paths within the PIMs 202a–202n. In one example, the circuit 200 may be implemented using a 0.18 μm process. However, other technologies may be implemented to meet the design criteria of a particular implementation.

The circuit 100 may be implemented to construct multiplexers, since the circuit 100 may allow an input that may already be heavily loaded to incur a small loading penalty when connecting to multiple multiplexer bits. Connecting an input to an multiple multiplexer bits may enhance the overall routability of a switching matrix. The circuit 100 may allow speed critical multiplexers to be implemented without suffering a performance penalty due to having other multiplexer bits connected to one or more of input lines.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. For example, inverters may be added at the output or within the circuit 100 (or 100') to change a particular polarity of the signals.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:

an input section configured to generate a first control signal and a second control signal in response to an input signal and a select signal, wherein said input section comprises a first device and a second device each having a source and a drain configured to connect said input signal with said first control signal and said second control signal in response to said select signal; and an output section configured to generate an output signal in response to said first and said second control signals, wherein said output signal is (i) related to said input signal when in a first mode and (ii) disabled when in a second mode, wherein one or more third devices each have a source and a drain configured to connect said first control signal to said second control signal when in said first mode.

2. The apparatus according to claim 1, wherein said apparatus comprises a push-pull multiplexer bit.

3. The apparatus according to claim 1, wherein an output load of said output signal is independent of an input load of said input signal.

4. The apparatus according to claim 3, wherein said output load is independent of said select signal.

5. The apparatus according to claim 1, wherein said first and second control signals are configured to eliminate output loading of said output signal from said input signal.

6. The apparatus according to claim 1, wherein coupling of non-selected inputs to said output signal is eliminated.

7. The apparatus according to claim 1, wherein said output signal comprises a complement of said input signal when in said first mode.

8. The apparatus according to claim 1, further comprising two or more of each of said input section or said output section, configured as a multiplexer or a programmable interconnect matrix.

9. The apparatus according to claim 1, wherein said input section is further configured in response to a complement of said select signal.

10. The apparatus according to claim 1, wherein said first and said second modes are controlled by said first and said second control signals.

11. The apparatus according to claim 1, wherein said input section further comprises:

one or more fourth devices coupled to said first and said second devices and configured to generate said first and said second control signals.

12. The apparatus according to claim 11, wherein:

said one or more fourth devices are coupled to (i) said select signal and (ii) a supply voltage or a ground voltage.

13. The apparatus according to claim 12, wherein said output section comprises:

one or more fifth devices; and one or more sixth devices, wherein said fifth and said sixth devices are configured to present said output signal in response to said first and said second control signals.

14. The apparatus according to claim 11, wherein said first mode comprises an enabled mode and said second mode comprises a disabled mode.

15. An apparatus comprising:

means for generating a first control signal and a second control signal in response to an input signal and a select signal, wherein said input signal is connected to said first and said second control signals in response to a first state of said select signal; and means for generating an output signal in response to said first and said second control signals, wherein said output signal is (i) related to said input signal when in a first mode and (ii) disabled when in a second mode, wherein one or more devices each have a source and a drain configured to connect said first control signal to said second control signal when in said first mode.

16. A method for tri-stating an output of a bit, comprising the steps of:

(A) generating said output in response to a first control signal and a second control signal;

(B) connecting an input to said first and second control signals when in a first mode; and (C) isolating said first and said second control signals from said input when in a second mode, wherein one or more first devices each have a source and a drain configured to connect said first control signal and said second control signal when in said first mode.

17. The method according to claim 16, wherein said connecting step further comprises:

turning on one or more second devices; and turning off one or more third devices.

18. The method according to claim 17, wherein said isolating step further comprises:

turning on said one or more third devices; and turning off said one or more first and said one or more second devices.

19. The method according to claim 16, wherein said first mode comprises an enabled mode and said second mode comprises a disabled mode.

20. The method according to claim 16, wherein said bit comprises a multiplexer bit.

21. The apparatus according to claim 1, wherein said output signal tracks said input signal and swings from rail.

* * * * *